United States Patent [19]
Amin et al.
[11] 3,762,965
[45] Oct. 2, 1973

[54] SOLDER COMPOSITIONS OF IMPROVED ACTIVE SOLDER VEHICLES

[75] Inventors: Rajnikant B. Amin, Wilmington, Del.; John R. Larry, Youngstown, N.Y.

[73] Assignee: E. I. du Pont de Nemours and Company, Wilmington, Del.

[22] Filed: July 27, 1971

[21] Appl. No.: 166,632

[52] U.S. Cl. .................................... 148/24, 148/25
[51] Int. Cl. ........................ B23k 35/24, B23k 35/24
[58] Field of Search ................................ 148/22, 24

[56] References Cited

UNITED STATES PATENTS

| | | | |
|---|---|---|---|
| 2,690,408 | 9/1954 | Pessel | 148/24 |
| 3,065,538 | 11/1962 | Melchiors | 148/24 |
| 2,631,952 | 3/1953 | Williams | 148/24 |

OTHER PUBLICATIONS

Eirich, "Rheology: Theory & Applications," Vol. 4, p. 457 (1967).

*Primary Examiner*—L. Dewayne Rutledge
*Assistant Examiner*—Peter D. Rosenberg
*Attorney*—James A. Forstner

[57] ABSTRACT

Novel vehicles comprising an active chloride-containing organic compound which is capable of removing surface oxides from soldering metals, a thixotropic agent, rosin (or derivatives thereof) and an organic solvent. These vehicles are used to form solder compositions which contain finely divided solder metals dispersed in the vehicle. Solder compositions which are useful for either screen-printing or dipping techniques may be formed. The use of this novel vehicle provides good solder flowability at soldering temperatures, good solder bonds, and reduced solderball formation. These compositions are particularly suited for soldering electronic circuitry.

11 Claims, No Drawings

SOLDER COMPOSITIONS OF IMPROVED ACTIVE SOLDER VEHICLES

BACKGROUND OF THE INVENTION

This invention relates to electronic circuitry, and more particularly to solder vehicles and solder compositions made therewith.

Generally, the soldering of metals is effected by applying a soldering medium or flux on the place to be soldered, and then applying the solder with a soldering iron or the like. Alternatively, solder preforms have been used wherein a preform is heated to a molten state whereby it forms a good solder bond. Various preforms have to be made for each individual situation. Consequently, the entire soldering process is very time consuming and expensive.

Various attempts have been made to produce solder compositions suitable for use with electronic circuitry (e.g., compositions which are screen-printable, dip-applicable, or syringe-dispensable). In each case, the vehicles used must (1) provide good applicability, (2) be active and remove surface oxides at the melting point of the solder metals, and (3) leave little residue, which is easily removed by organic solvents.

It is the object of this invention to provide a new and improved vehicle which can be used to produce solder compositions that overcome the deficiencies of the prior art, specifically, which can be applied easily and which are active to remove oxide coatings (e.g., from Ni, Pd, etc. metallizations) and which leave little residue.

SUMMARY OF THE INVENTION

This invention concerns a vehicle comprising, by weight, (a) 2–40 percent of an active chloride-containing organic compound which releases chloride ions or hydrogen chloride below about 350°C., (b) 0.5–10 percent of a thixotropic agent, (c) 30–60 percent of an organic solvent, and (d) 20–50 percent of rosin or derivatives thereof. Such active chloride organic compounds include acid hydrochlorides and amine hydrochlorides, such as glutamic acid hydrochloride and propylamine hydrochloride. Such active chloride compounds remove oxides from metal surfaces and facilitate good soldering, and leave little residue.

Also a part of this invention are solder compositions, which are useful in electronic circuitry, of finely divided metal in the above vehicle.

DETAILED DESCRIPTION

The active chloride-containing compound (a) in the vehicle and solder compositions of the present invention serves the function of enhancing solderability by removing oxide coatings from metal surfaces, either in the solder or on the object soldered. Thus, often an electronic object such as a multilayer capacitor will be terminated by a silver electrode. The silver electrode is often plated with nickel to form a barrier between the thin silver electrode and the solder to be applied over the same while attaching the capacitor to another part of an electronic circuit. However, nickel is subject to the formation of nickel oxide coatings. The active chloride flux of the present invention dissolves away the oxide coating and facilitates soldering.

The active chloride flux of the present invention is an organic compound, to minimize the presence of residues after soldering, such as would remain if an inorganic flux such as $ZnCl_2$ were used. Specifically, the active chloride flux is an organic compound which releases chloride ions and/or hydrogen chloride at solder temperatures, usually no greater than about 350°C. Such compounds include organic acid hydrochlorides and amine hydrochlorides. Illustrative of such compounds are propylamine hydrochloride, glutamic acid hydrochloride, triethylamine hydrochloride, triaminoguanidine hydrochloride, benzidine hydrochloride, 1,2,4-benzenetriamine dihydrochloride, and 3,5-diaminobenzoic acid dihydrochloride.

The active chloride compound may be either a liquid or a solid. If a solid, a dispersion thereof in the other components of the vehicle is formed.

The operable proportions of the active chloride-containing compound is in the range 2–40 percent of the vehicle, with the preferred range being 10–25 percent. At least 2 percent is present to remove surface oxides of the solder metals and to help the solder metal coalesce during firing to form a smooth continuous surface.

The second component of the vehicle is a thixotropic agent (b). Its purpose is to increase the viscosity of the vehicle to the desired consistency and to increase the loading capacity of the vehicle. It also prevents settling of solder alloy particles and hence increases shelf life. The amount of thixotropic agent is within the range 0.5–10 percent. More than 10 percent severly hinders the coalescing power of the vehicle system. Any thixotropic agent can be used, provided that it does not leave a residue insoluble in organic solvents (e.g., trichloroethylene) on the solder metal, after the firing operation. Common thixotropic agents are disclosed by Eirich, "Rheology," Academic Press, New York, 1967, Vol. 4, page 457. A preferred thixotropic agent is hydrogenated castor oil (Baker Castor Oil Co. "Thixatrol").

The third component of the vehicle is an organic solvent or medium (c), present in amounts in the range 30–60 percent, preferably 40–60 percent, of the vehicle. The organic solvent provides the proper consistency for the vehicle. If more than about 60 percent organic solvent is present, the finely divided solder metal will not remain dispersed in the liquid vehicle of a screen printable solder composition. Any of the common organic solvents may be used, such as acetone, benzene, toluene, aliphatic alcohols, mineral spirits, carbon tetrachloride, the terpenes (e.g., beta-terpineol), ethylene glycol, glycerol, methyl ethyl ketone, and mixtures thereof.

The fourth component (d) of the vehicle of the present invention is 20–50 percent rosin or derivatives thereof, preferably 30–40 percent. Rosin, the non-steam-volatile fraction of pine oleoresin, is a mixture of five isomeric diterpene acids, the most abundant component being abietic acid. The terminology "rosin and derivatives thereof" includes rosin, the acids in rosin, wood rosin, and any of their derivatives, such as "Staybelite", "Poly-Pale", "Dimerex", "Vinsol", etc. The purpose of the rosin is to increase the viscosity of the vehicle to the desired consistency, to act as a flux and to enhance storage stability. The use of more than 50 percent thereof provides vehicles which have a very high viscosity and poor viscosity properties.

Other conventional screen printing constituents, viscosity modifiers, etc. may also be present in the solder compositions of this invention. Common rheology modifiers may be included provided they do not adversely affect the properties of the compositions.

The various proportions of the vehicle are selected from the above ranges to achieve the desired physical properties, depending upon whether solder application is to be by printing, dipping, or syringe techniques.

When the solder compositions of the present invention are to be applied by dipping techniques, the thixotropic vehicles of the present invention have viscosities in the range 27,000–110,000 centipoises at 10 rpm, and 450,000–1,100,000 centipoises at 0.5 rpm, each determined by a Brookfield viscometer HBT at 25°C. using a No. 6 spindle. When applied by screen printing techniques, they have viscosities in the range 125,000–385,000 centipoises at 10 rpm and 1,350,000–3,850,000 centipoises at 0.5 rpm, measured under the above conditions.

The vehicle of the present invention is prepared simply by admixing the components with one another. Known techniques may be employed. Where the active chloride constituent is a solid (e.g., propylamine hydrochloride), it is preferred that the rosin and thixotropic agent be dissolved in the solvent, prior to dispersal of the solid active chloride compound therein. It is even more preferred to grind the latter until it passes through a No. 150 screen (all references to screens herein are to U.S. Standard Sieve Scale) prior to dispersion thereof in the other components.

The solder compositions of this invention contain finely divided solder metals dispersed in the vehicle. The solder metals can be any of the conventional single or multiphase metals normally used for soldering, including gold, silver, tin, germanium, silicon, antimony, bismuth, lead, indium, gallium, zinc, copper, phosphorous, and alloys thereof and mixtures thereof. The solder metal particles should be fine enough to pass through a No. 100 screen (or smaller).

The solder compositions are conventionally prepared by admixing the solder metals and the vehicle in any ratio, but preferably at ratios between 1:20 to 20:1, by weight. Screen printable solder compositions may then be applied to any suitable substrate, particularly metal substrates, to form a solder pad. Alternately, objects to be dip soldered are dipped into the solder composition by conventional techniques. Thereafter, the solder is heated to a temperature at which the solder becomes molten and a highly adherent solder bond is formed. Any atmosphere may be used (e.g., air, inert or reducing).

EXAMPLES

The following examples are presented to illustrate the present invention. In the examples and elsewhere in the specification all parts, percentages and proportions are by weight.

Vehicles were prepared by dissolving rosin (Hercules "Staybelite" hydrogenated wood rosin) and thixotropic agent (Baker Castor Oil Co. "Thixotrol" hydrogenated caster oil) in solvent (beta-terpineol), then uniformly dispersing the active chloride compound therein with a magnetic stirrer. Metal solder particles were then stirred in with a spatula.

EXAMPLES 1–6

In Examples 1–6 vehicles and solder compositions thereof, as specified in the Table, were prepared for application by dip coating on multilayer capacitors. The capacitors had buried electrodes in a barium-titanate dielectric and silver terminal electrodes with a nickel barrier coating. The capacitors were dipped into the solder composition (solder wetting was good to excellent in each Example) and fired to the temperature noted in the Table. The fired products showed no solder balls and low residue and had excellent storage characteristics. Examples 1 and 2 were run with commercially available glutamic acid hydrochloride (particle size larger than No. 80 mesh.) Example 1 was rerun with more finely ground glutamic acid hydrochloride (passed through No. 150 sieve), with improved dispersion and handling characteristics. The active chloride flux of Examples 4–6 passed through a No. 170 sieve, and that of Example 3 through a No. 150 sieve.

The viscosity of the thixotropic vehicles of Examples 4–6 were in the range 30,000–100,000 centipoises as measured at 10 rpm by a Brookfield viscometer HBT at 25°C. using a No. 6 spindle, and 500,000–1,000,000 centipoises at 0.5 rpm.

EXAMPLES 7–11

In Examples 7-11 screen printable solder compositions were made with the vehicles of the present invention. In each of Examples 7–11 the active chloride flux was a solid of particle size which passed through a No. 170 screen. Viscosities were in the range 140,000–350,000 cps on a Brookfield viscometer at 25°C. using a No. 6 spindle at 10 rpm, and in the range 1,500,000–3,500,000 at 0.5 rpm.

These compositions were each screen printed onto a preformed conductor pad on an alumina substrate. The entire assembly was then heated in air to the soldering temperature specified in the Table. Screen printability was excellent in each example, solder wetting was good to excellent, no solder balls were observed, residue was quite low, and storage characteristics were excellent.

EXAMPLE 12

The solder composition of this example was applied by syringe to a conductor pad on an alumina substrate and performed as in previous examples.

These examples show excellent application characteristics, good solder wetting, minimal residue, little or no solder ball effect, excellent storage stability (i.e., the metal particles remain suspended in the vehicle), and high metal load capacity using the vehicles of the present invention. These solder compositions also permit the application of thick prints (i.e., greater than 1 mil in height) without spreading of the print.

TABLE

| Example number | 1 | 2 | 3 | 4 | 5 | 6 | 7 | 8 | 9 | 10 | 11 | 12 |
|---|---|---|---|---|---|---|---|---|---|---|---|---|
| Composition: | | | | | | | | | | | | |
| Vehicle (wt. percent) | 20 | 15 | 20 | 25 | 25 | 25 | 15 | 15 | 15 | 15 | 15 | 20 |
| (a) Glutam c acid/HCl | 20 | 20 | 20 | 14.2 | 14.2 | | | | | | | 2 |
| (a) Propylamine/HCl | | | | | | 15 | 15 | 15 | 15 | 15 | 15 | |
| (b) Hydrogenated castor oil | 3 | 3 | 3 | 2.2 | 3.1 | 3 | 3 | 3 | 3 | 3 | 3 | 3 |
| (c) Eeta-terpineol | 42 | 42 | 42 | 58.6 | 47.2 | 47 | 47 | 47 | 47 | 47 | 47 | 58 |
| (d) Hydrogenated rosin | 35 | 35 | 35 | 25 | 35.6 | 35 | 35 | 35 | 35 | 35 | 35 | 37 |
| Metal (wt. percent) | 80 | 85 | 80 | 75 | 75 | 75 | 85 | 85 | 85 | 85 | 85 | 80 |
| Tin | 62 | 62 | 95 | 95 | 62 | 62 | 62 | 95 | 95 | 10 | 60 | 10 |
| Lead | 36 | 36 | | | 36 | 36 | 36 | | | 90 | 40 | 90 |
| Silver | 2 | 2 | 5 | 5 | 2 | 2 | 2 | 5 | | | | |
| Antimony | | | | | | | | | 5 | | | |
| Temperature (° C.) | 220 | 220 | 250 | 250 | 220 | 220 | 220 | 250 | 260–300 | 320–350 | 220 | 320–350 |

We claim:

1. A solder composition exhibiting thixotropy comprising finely divided solder metal dispersed in a vehicle comprising, by weight, (a) 2–40 percent of propylamine hydrochloride, (b) 0.5–10 percent of a thixotropic agent which after firing does not leave on the solder metal a residue which is insoluble in organic solvents, (c) 30–60 percent of an organic solvent and (d) 20–50 percent of rosin or derivatives thereof.

2. A composition according to claim 1 wherein the metal is from the group consisting of gold, silver, tin, germanium, lead, antimony, alloys thereof, and mixtures thereof.

3. A composition according to claim 1 wherein the metal is a tin/antimony alloy.

4. A composition according to claim 1 wherein the metal is a tin/lead alloy.

5. A composition according to claim 1 wherein the metal is a tin/silver alloy.

6. A composition according to claim 1 wherein the metal is a gold/tin alloy.

7. A composition according to claim 1 wherein the metal is a gold/antimony alloy.

8. A vehicle according to claim 1 comprising, by weight 10–25 percent (a), 0.5–10 percent (b), 40–60 percent (c), and 30–40 percent (d).

9. A vehicle according to claim 8 wherein the thixotropic agent (b) is hydrogenated castor oil.

10. A solder composition of finely divided solder metal in the vehicle of claim 8.

11. A vehicle according to claim 1 wherein the thixotropic agent (b) is hydrogenated castor oil.

* * * * *